(12) United States Patent
Ishida

(10) Patent No.: US 7,049,513 B2
(45) Date of Patent: May 23, 2006

(54) CARD-MOUNTING RACK FOR ELECTRONIC PART-MOUNTING CARDS

(75) Inventor: Hisashi Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 115 days.

(21) Appl. No.: 10/631,721

(22) Filed: Aug. 1, 2003

(65) Prior Publication Data

US 2004/0022045 A1    Feb. 5, 2004

(30) Foreign Application Priority Data

Aug. 2, 2002    (JP) .............................. 2002-226435

(51) Int. Cl.
*H02G 3/18*    (2006.01)

(52) U.S. Cl. .................. 174/59; 174/52.1; 174/50; 439/377; 439/61; 439/342; 361/756; 361/802; 361/684; 361/683

(58) Field of Classification Search .............. 174/52.1, 174/50, 59; 439/377, 61, 342; 361/756, 361/802, 684, 683
See application file for complete search history.

(56) References Cited

U.S. PATENT DOCUMENTS 5,366,385 A    11/1994    Treleaven
5,460,441 A *  10/1995   Hastings et al. ............ 312/298
5,868,585 A    2/1999    Barthel et al.
6,323,423 B1 * 11/2001   Tirrell et al. ................ 174/52.1
6,621,709 B1 * 9/2003    Schnabel et al. ........... 361/756

FOREIGN PATENT DOCUMENTS

JP    10-178289 A    6/1998

* cited by examiner

*Primary Examiner*—Dean A. Reichard
*Assistant Examiner*—Anton Harris
(74) *Attorney, Agent, or Firm*—Sughrue Mion, PLLC

(57) ABSTRACT

A card-mounting rack for electronic part-mounting cards is disclosed by which a housing of a rack or the like produced in accordance with standard specifications can be used to mount a plurality of large cards in high density therein to achieve overall densification and miniaturization of a system such as a computer system. Cooling fans are provided on a front and rear faces of a housing of a rack. A mother board is horizontally placed at the center of the inside of the housing. A plurality of cards are mounted perpendicularly on top and bottom faces of the mother board using gondolas and driving mechanisms having a function for moving the cards upwardly or downwardly through a plurality of connector provided on the top and bottom faces of the motherboard. Further, spacers for stabilizing the cards are inserted on rear faces of the cards.

9 Claims, 5 Drawing Sheets

CARD-MOUNTING RACK FOR ELECTRONIC PART-MOUNTING CARDS

BACKGROUND OF THE INVENTION

1. Field of the Invention

The present invention relates to a card-mounting rack for electronic part-mounting cards for mounting parts of the card type such as electronic circuit boards for construction of a computer system or the like in high density into a housing.

2. Description of the Related Art

Conventionally, when a plurality of parts of the card type (a part of the type mentioned is hereinafter referred to merely as card) such as electronic circuit boards on which electronic parts are mounted are accommodated into the inside of a housing of a standardized rack such as a 19-inch rack or the like to construct a system such as a computer system, such a conventional method as disclosed in Japanese Patent Laid-Open No. 10-178289 and U.S. Pat. No. 5,868,585 is used. According to the method, a mother board is mounted in the inside of a housing such that it extends in parallel to the side faces of the housing but perpendicularly to the bottom face of the housing. Further, a plurality of cards are mounted only on one face or side of the mother board such that they extend in parallel to the bottom face of the housing. In such a mounting method as just described, the cards are connected to the mother board only in a limited one direction. Therefore, the length of a cable necessary for connection between the cards increases as the number of cards to be mounted onto one mother board increases. Such increase of the length of a connection cable between cards as just described makes a cause of signal delay, noise increase and so forth. As a result, it becomes a factor that the performance of the entire system is degraded.

In order to suppress such degradation of the system performance arising from increase of the length of a connection cable between cards as just described, the following method may be used. In particular, in order to reduce the length of a connection cable between cards, a mother board is placed at the center of a housing such that it extends in parallel to the side faces of the housing but perpendicularly to the bottom face of the housing and a plurality of cards are mounted on both faces of the mother board provided at the center of the housing such that they extend in parallel to the bottom face of the housing. However, according to such a mounting method as just described, the size of cards is limited by the width of the housing, and a card having a size generally used for the 19-inch standard rack cannot be mounted.

Also another method may be used wherein, in order to prevent occurrence of such a limitation to the size of the cards as just described, a mother board is placed at the center of a housing such that it extends perpendicularly to the side faces and the bottom face of the housing and a plurality of cards are mounted on both faces of the mother board provided at the center of the housing such that they extend in parallel to the bottom face of the housing.

However, in such mounting methods as described above, an air flow for cooling generated in the inside of the housing of a rack or the like by sucking air from the front face of the housing and exhausting air to the rear face of the housing is intercepted by the mother board provided at the center of the housing. This gives rise to a problem that the cooling system does not sufficiently function. A method wherein air is sucked from a lower portion of a housing and exhausted from an upper portion of the housing may be used as alternate measures without using the general cooling system of the front face air sucking and rear face air exhausting type described above. However, in the cooling system of the bottom face air sucking and top face air exhausting type, it is necessary to assure a space for the location of cooling fans above and below cards to be mounted. Therefore, when a system such as a computer system is constructed, the height of a housing of a rack or the like becomes greater than that of a housing of a standard rack or the like and the mounting density of electronic parts other than a mother board and cards to be mounted in the housing decreases. As a result, a problem occurs that improvement of the performance of the entire system by high-density mounting and miniaturization is obstructed.

SUMMARY OF THE INVENTION

It is an object of the present invention to provide a card-mounting rack for electronic part-mounting cards wherein a housing of a rack or the like produced in accordance with standard specifications can be used to mount a plurality of large cards in high density therein to achieve overall densification and miniaturization of a system such as a computer system.

In order to attain the object described above, according to the present invention, there is provided a card-mounting rack for electronic part-mounting cards for mounting a plurality of cards each having an electronic part and a connector mounted thereon, comprising a mother board disposed horizontally, a plurality of platforms, a driving mechanism provided for each of the platforms for moving the platform upwardly or downwardly toward the mother board, a card guide provided for each of the platforms for guiding one of the cards for movement in a horizontal direction to send the card onto the platform, and a mother board side connector provided on a bottom face or a top face of the mother board for each of the cards, the connector of any of the cards being connected to one of the mother board side connectors when, after the card is sent onto the corresponding platform under the guidance of the corresponding card guide, the platform is moved upwardly or downwardly toward the mother board by the corresponding driving mechanism.

The mother board side connectors may be provided on the top face and the bottom face of the motherboard, and a plurality of units each formed from one of the platforms, one of the driving mechanisms and one of the card guides may be provided symmetrically in upward and downward directions on the upper and lower sides of the mother board.

The driving mechanism may include a gondola for retaining a card on the corresponding platform and a guide rail for guiding the gondola upon upward or downward movement of the platform.

The driving mechanism may include a ball screw held in meshing engagement with a threaded hole provided on the corresponding platform, a first bevel gear fixed to the ball screw, a second bevel gear held in meshing engagement with the first bevel gear, and a rotating tool for rotating the second bevel gear to rotate the first bevel gear thereby to rotate the ball screw to move the platform upwardly and downwardly.

Preferably, the gondola is formed from a material which intercepts magnetism and electromagnetic waves.

Preferably, fans for generating air flows to cool the cards are provided.

With the card mounting rack, cards are mounted on one or both of the top and bottom faces of the mother board horizontally placed in the inside of the rack such that they extend in parallel to the side faces of the rack but perpendicularly to the mother board placed horizontally in the inside of the rack. Consequently, the card mounting rack according to the present invention can mount a plurality of large size cards without a limitation to the width of the rack. Therefore, the length of a connection cable between the cards can be reduced, and degradation of a system performance arising from increase of the connection cable between the cards can be suppressed. Further, heat generated from the mother board and the cards in the rack can be radiated efficiently by a cooling system of the front face air sucking and rear face air exhausting type implemented by the cooling fans provided on the front and rear faces of the rack. Therefore, the cooling system may not be provided on upper and lower portions of the rack, and a high-density mounting mechanism free from a dead space can be achieved. Further, it is possible to operate the driving mechanism from both of the front and rear faces of the rack to mount and dismount a card. Therefore, a card exchanging operation can be performed efficiently. Furthermore, if a material having an electromagnetic wave intercepting property is used as the material for forming the gondolas, then occurrence of a problem that electromagnetic wave which is generated from the cards upon driving of the cards leaks to the outside can be prevented.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
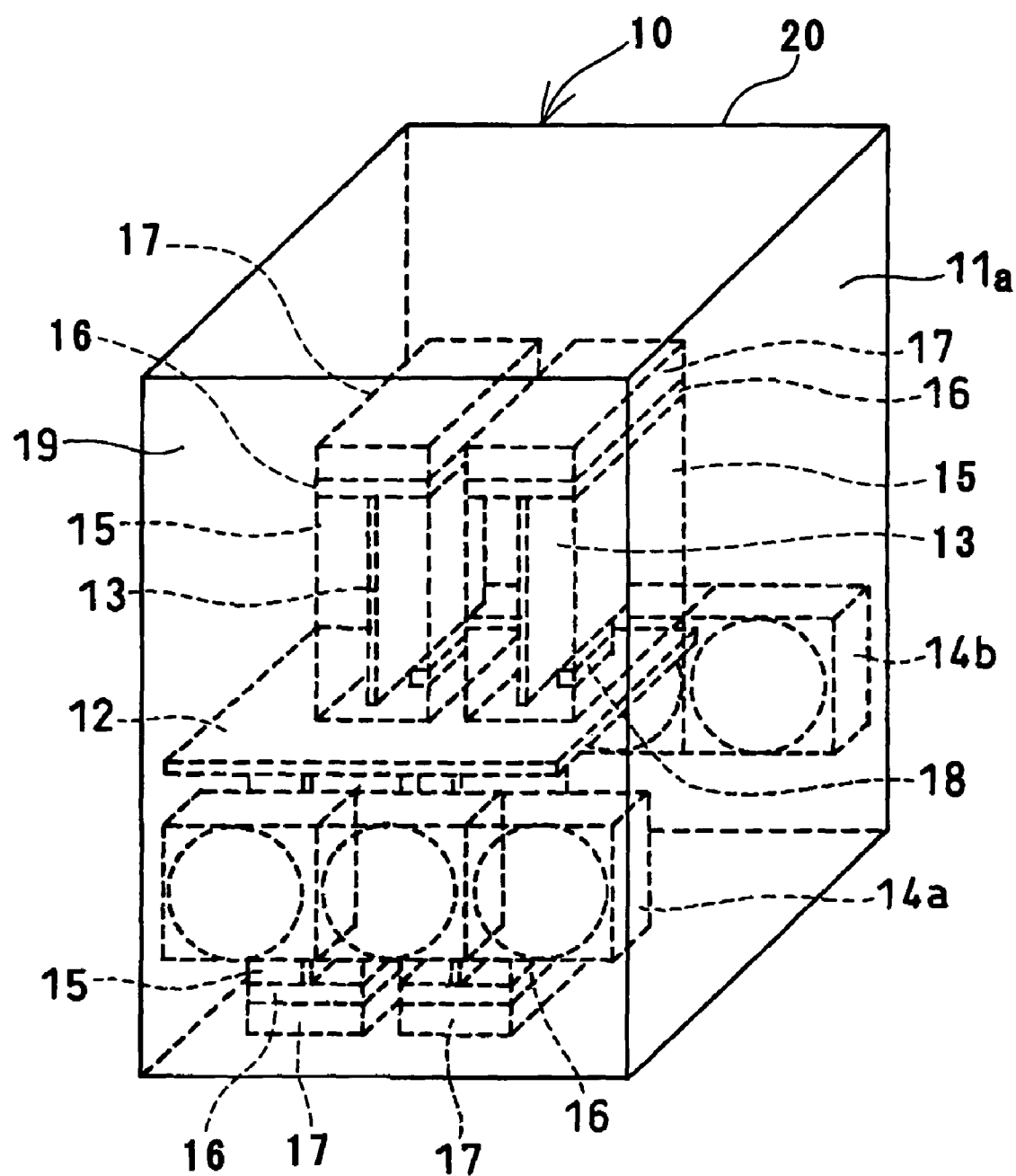
FIG. 1 is a perspective view of a card-mounting rack for electronic part-mounting cards according to an embodiment of the present invention.

Referring to FIG. 1, there is shown a card mounting rack according to an embodiment of the present invention. The card mounting rack includes cooling fans 14a and 14b provided on inner faces of a front face panel 19 and a rear face panel 20 of a housing 11a of a rack 11, respectively. The cooling fans 14a provided on the front face panel 19 of the rack 11 suck air from the outside of the housing 11a. The cooling fans 14b provided on the rear face panel 20 of the housing 11a exhaust air having absorbed heat generated upon driving of system components such as a mother board 12, cards 13 and so forth mounted in the inside of the housing 11a to the outside of the housing 11a.

Figure 2:
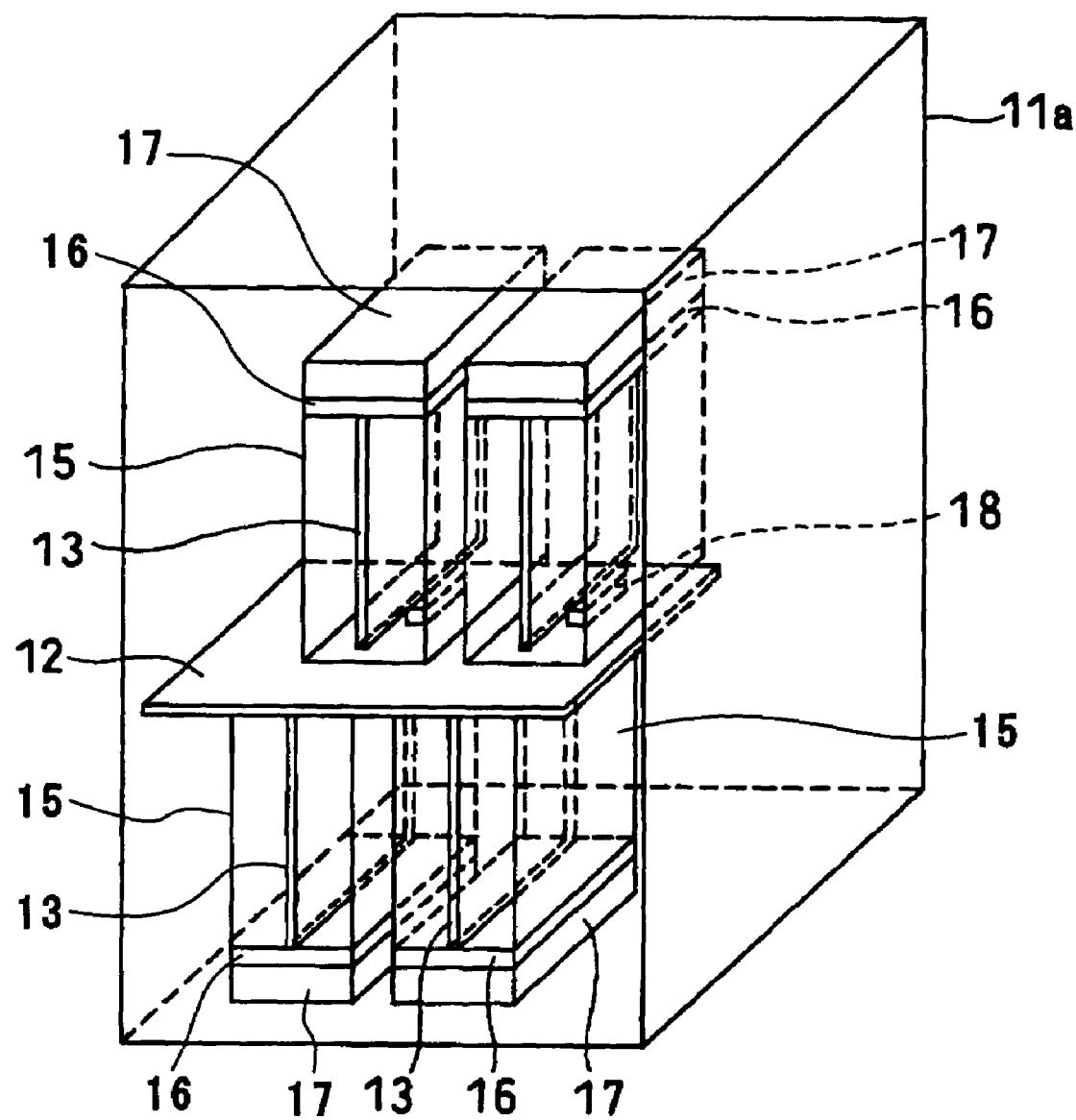
FIG. 2 is a perspective view showing part of the card-mounting rack for electronic part-mounting cards other than panels on the front and rear faces and cooling fans.

Referring now to FIG. 2, the mother board 12 is horizontally placed at the vertically central position in the inside of the housing 11a. A plurality of cards 13 are mounted on upper and lower faces of the mother board 12 through a plurality of connectors 18 provided on the upper and lower faces of the mother board 12. The cards 13 are placed in respective gondolas 15 provided on both of the upper and lower faces or sides of the mother board 12 for moving the cards 13 in upward and downward directions to mount them onto the mother board 12. Driving mechanisms 17 for moving the respective gondolas 15 in upward and downward directions to move the cards 13 in upward and downward directions to insert or remove the cards 13 onto or from the mother board 12 are provided on the upper side of the gondolas 15 provided on the upper side of the mother board 12 and on the lower side of the gondolas 15 provided on the lower side of the mother board 12. Spacers 16 for fixing the cards 13 to protect them from an influence of vibration and so forth are mounted individually between the driving mechanisms 17 and the cards 13.

In the embodiment, a pair of gondola 15 and a pair of driving mechanisms 17 for individually moving the gondolas 15 in upward and downward directions are provided on each of the upper and lower sides of the mother board 12. Each set of a gondola 15 and a corresponding driving mechanism 17 is hereinafter referred to as unit. However, the units have a structure substantially same as each other and are disposed vertically symmetrically with each other. Thus, the structure of the units is described below taking the units provided on the lower side of the mother board 12 as an example.

Figure 3:
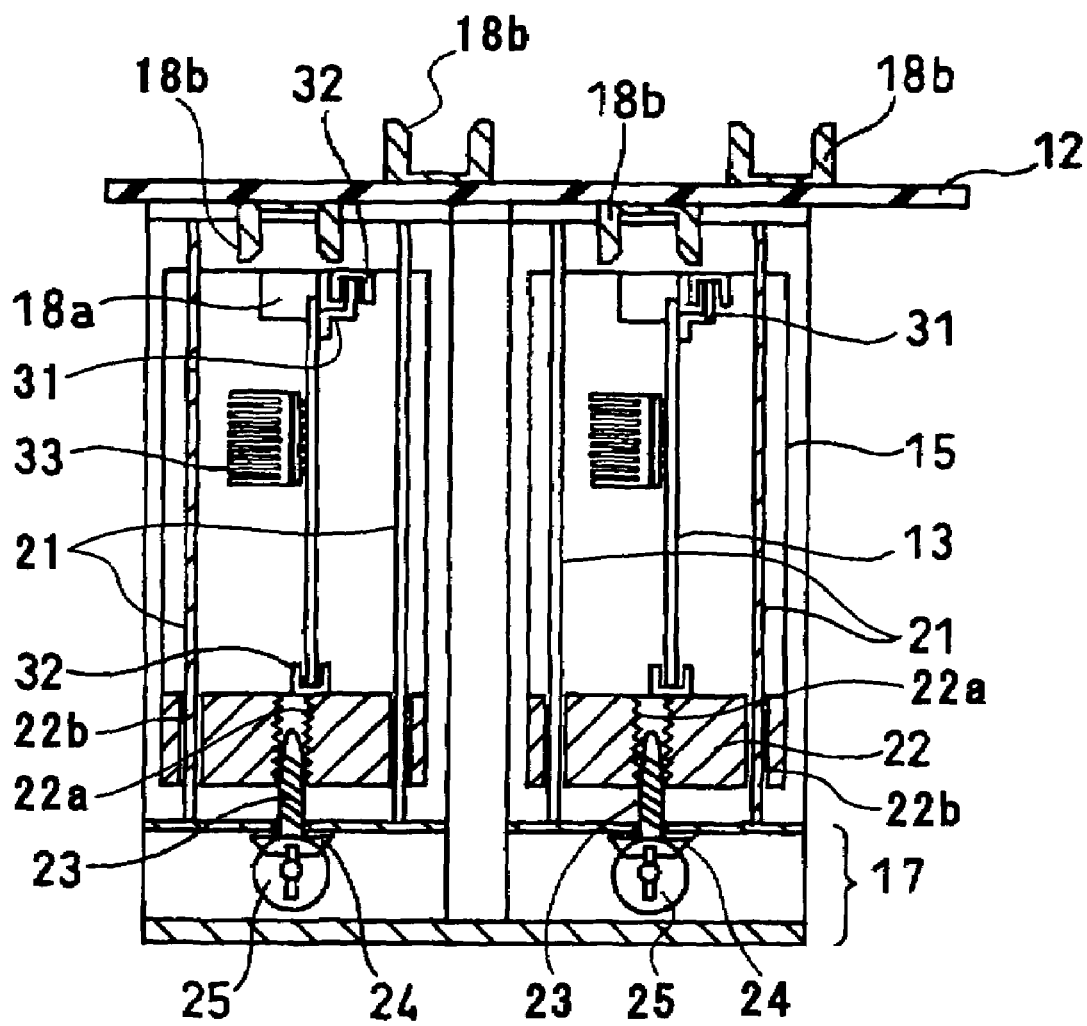
FIG. 3 is a schematic sectional view of the card-mounting rack for electronic part-mounting cards.

Referring now to FIG. 3, each of the gondolas 15 shown includes card rails 32 provided as a card guide on upper and lower portions thereof for guiding a card 13 for movement in a horizontal direction from the front face or the rear face of the rack not shown in FIG. 3 to place and retain the card 13 into and in the inside of the gondola 15 perpendicularly to the mother board 12. Guide rails 21 are provided such that they extend vertically from the upper portion to the lower portion of the gondola 15 for holding the side portions of the gondola 15 for sliding motion and serve as a gondola guide for guiding upward or downward movement of the gondola 15 at four corners of the gondola 15.

Further, a card side connector 18a is provided at the upper end, on the mother board 12 side, of the card 13 on which an LSI 33 is mounted. A guide edge panel 31 is provided in the proximity of the card side connector 18a. Further, the guide edge panel 31 and the lower end of the card 13 are fitted in the card rail 32 provided on the upper portion of the gondola 15 and the card rail 32 provided on the lower portion of the gondola 15, respectively, so that the card 13 is moved in a horizontal direction from the front face or the rear face side of the rack not shown under the guidance of the card rails 32 until it is guided to a correct position in the gondola 15. The card 13 is stably fixed in the inside of the gondola 15 by the card rails 32 also after it is accommodated into the gondola 15. The lower portion of the gondola 15 forms a platform 22 integrated with the gondola 15. A ball screw 23 is inserted in the threaded hole 22a and held in meshing engagement with a threaded hole 22a provided at the central portion of the platform 22. Further, a first bevel gear 24 is fixed coaxially to the ball screw 23 and a second bevel gear 25 is held in meshing engagement with the first bevel gear 24. If the second bevel gear 25 is rotated, then also the first bevel gear 24 is rotated thereby, and as a result, the ball screw 23 is rotated to move the platform 22 upwardly or downwardly. Guide holes 22b for allowing the perpendicular guide rails 21 to pass therethrough are provided at four corners of the platform 22.

Figure 4:
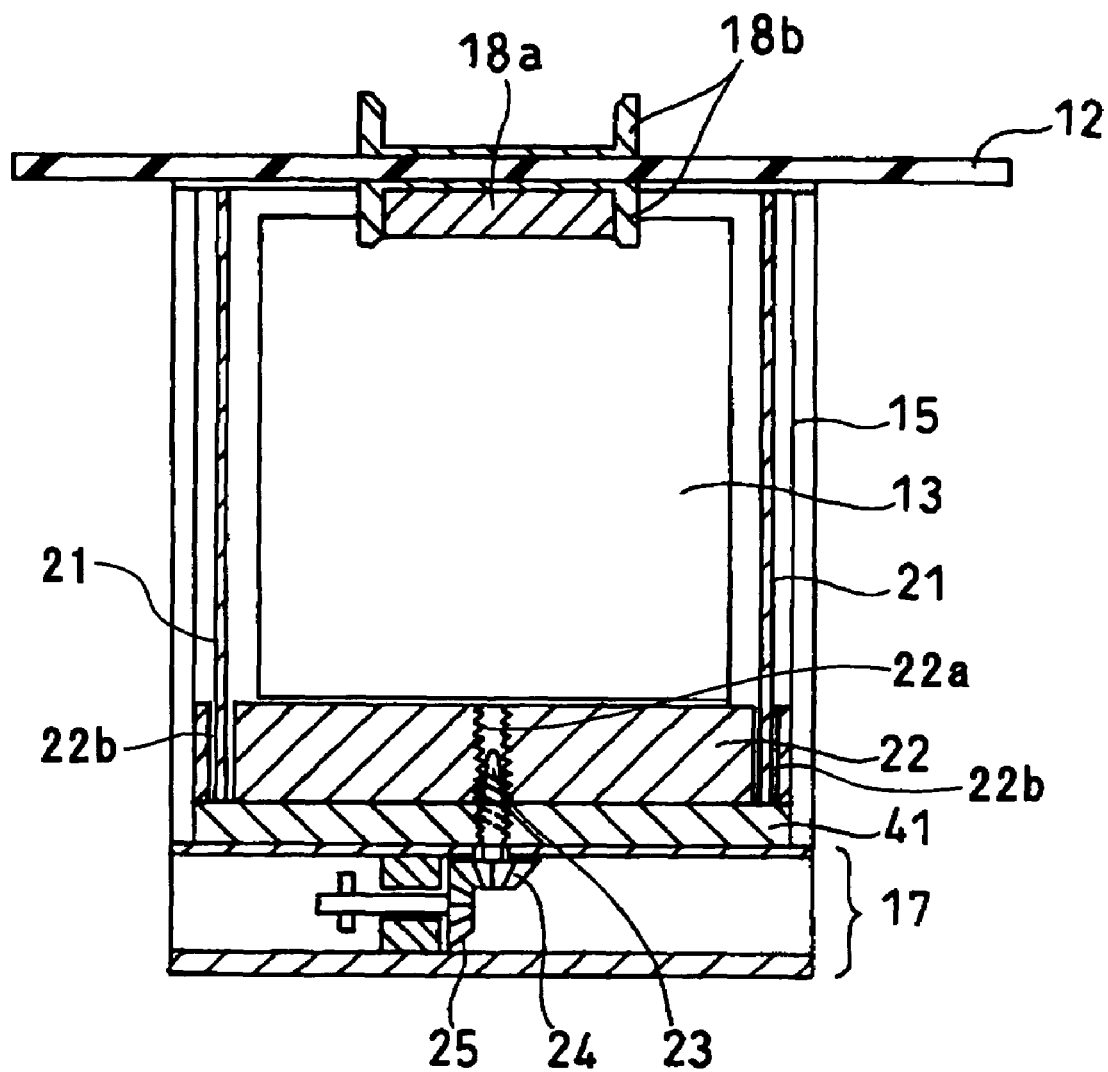
FIG. 4 is a schematic sectional view of the card-mounting rack for electronic part-mounting cards taken along a plane different from that used for the sectional view of FIG. 3.

Referring to FIG. 4, in the present embodiment, a spacer 41 for fixing the card 13 is inserted in the driving mechanism 17 side of the cord 13 connected to a mother board side connector 18*b* of the mother board 12 through the card side connector 18*a* so that the card side connector 18*a* provided on the upper end of the card 13 does not come off from the mother board side connector 18*b* by vibration and so forth upon driving of the system.

Figure 5:
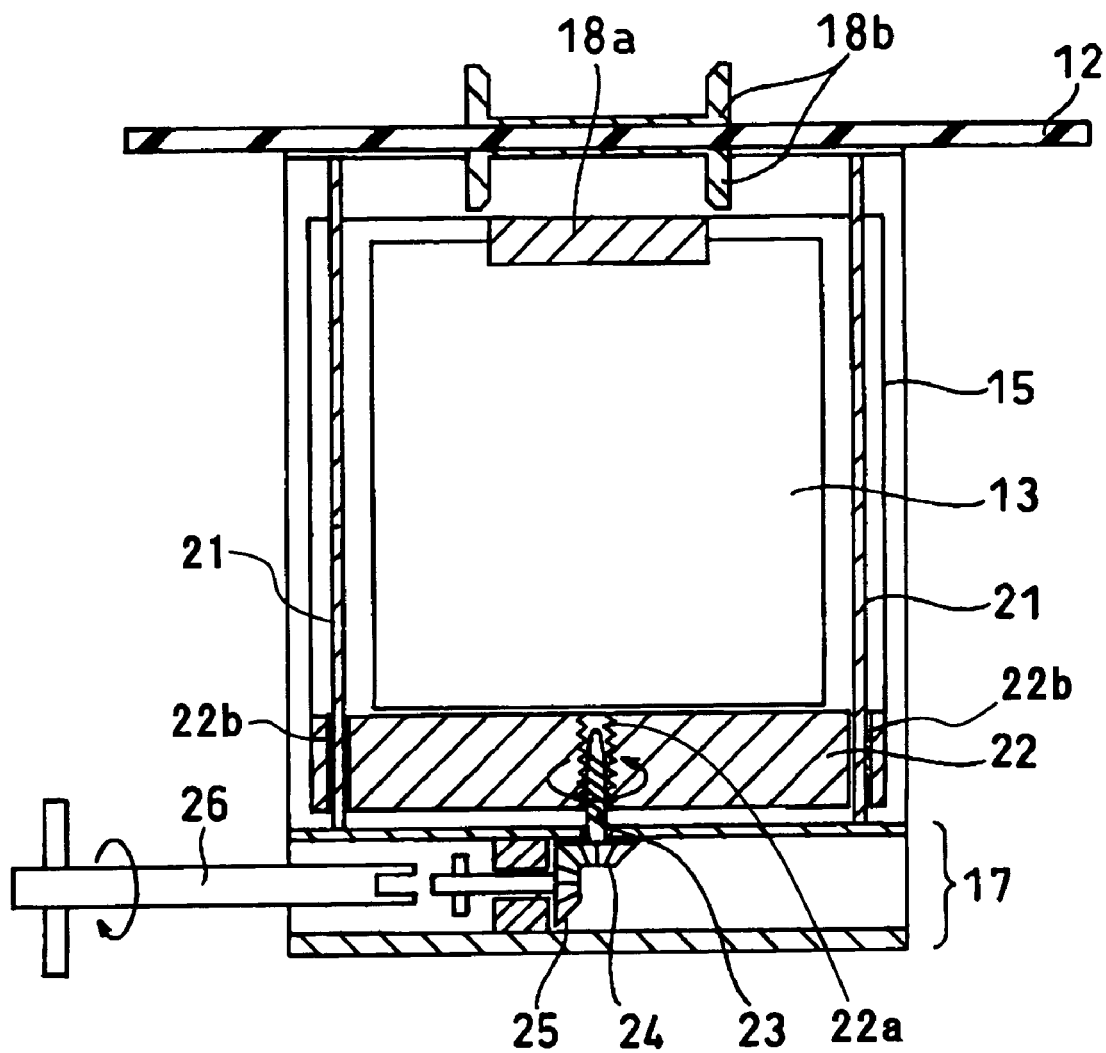
FIG. 5 is a sectional view illustrating operation of the card-mounting rack for electronic part-mounting cards.

Next, operation of the card mounting rack according to the present embodiment is described with reference to FIG. 5. If the second bevel gear 25 is rotated from the front or rear face side of the rack 11 not shown in FIG. 5 by force of rotation generated using a rotating tool 26 for rotating the ball screw 23, then the rotational force is transmitted to the ball screw 23 through the first bevel gear 24 held in meshing engagement with the second bevel gear 25. The ball screw 23 moves the platform 22 upwardly or downwardly by the rotational force thereof. The platform 22 moves the gondola 15 integrated therewith along the guide rails 21. Therefore, if force of rotation for moving the platform 22 upwardly is applied to the ball screw 23, then also the card 13 placed in the gondola 15 moves upwardly. Then, if the card 13 sufficiently moves upwardly, then the card side connector 18*a* provided at the upper end of the card 13 is inserted into the motherboard side connector 18*b* provided on the mother board 12 to connect the card 13 to the mother board 12. On the other hand, if force of rotation for moving the platform 22 downwardly is applied to the ball screw 23, then the platform 22 moves downwardly to move the gondola 15 downwardly along the guide rails 21. As a result, also the card 13 placed in the gondola 15 moves downwardly, and thereupon the card side connector 18*a* provided at the upper end of the card 13 comes off from the mother board side connector 18*b* provided on the mother board 12.

According to the present embodiment, a great number of cards 13 can be mounted in high density by placing the mother board 12 horizontally in the inside of the rack 11 and mounting a plurality of cards 13 from both of the top and bottom faces of the mother board 12 through the connectors 18. Therefore, such a problem of degradation of performance of the entire system arising from increase of the length of a connection cable between cards of the prior art methods as described above is eliminated. Further, the air-sucking cooling fan 14*a* and the air-exhausting cooling fan 14*b* for cooling heat generated upon driving of the mother board 12 and the cards 13 are provided on the front face panel 19 and the rear face panel 20 of the rack 11, respectively. Consequently, heat generated in the inside of the rack 11 can be radiated efficiently. Furthermore, in the present embodiment, each card 13 is mounted perpendicularly to the mother board 12 and the bottom faces of the rack 11. Therefore, the width of the rack 11 does not limit the size of the card 13 at all. Where there is the necessity to mount cards of a greater size, the card mounting rack of the present embodiment can be easily extended in a vertical direction and forward and backward directions of the rack.

Further, in the present embodiment, the gondola 15 is moved upwardly or downwardly in high accuracy along the guide rails 21. Therefore, the gondola 15 is not deflected in a left or right direction, and the card side connector 18*a* and the mother board side connector 18*b* are not displaced from each other. Further, if also the top face side of the mother board 12 is configured similarly with the structure just described, then a great number of cards can be mounted in high density.

It is to be noted that, in the present embodiment, a panel having an air-sucking cooling fan provided thereon and a panel having an air-exhausting cooling fan provided thereon are placed onto the front and rear faces of the rack 11, respectively, after predetermined numbers of cards 13 are mounted onto the top and bottom faces of the mother board 12. Consequently, heat generated from the mother board 12 and the cards 13 upon driving can be radiated efficiently.

Further, in the present embodiment, the material for forming the gondolas 15 is not limited specifically. Preferably, however, a material having an intercepting characteristic for magnetism and electromagnetic wave is used. Thus, occurrence of a problem that electromagnetic wave which is generated from the cards upon driving of the cards leaks to the outside can be prevented.

While a preferred embodiment of the present invention has been described using specific terms, such description is for illustrative purposes only, and it is to be understood that changes and variations may be made without departing from the spirit or scope of the following claims.

What is claimed is:

1. A card-mounting rack for electronic part-mounting cards for mounting a plurality of cards each having an electronic part and a connector mounted thereon, comprising:
    a mother board disposed horizontally;
    a plurality of platforms;
    a driving mechanism provided for each of said platforms which moves the platform upwardly or downwardly toward said mother board;
    a card guide provided for each of said platforms which guides one of the cards for movement in a horizontal direction to send the card onto the platform; and
    a mother board side connector provided on a bottom face or a top face of said mother board for each of the cards;
    the connector of any of the cards being connected to one of the mother board side connectors when, after the card is sent onto the corresponding platform under the guidance of the corresponding card guide, the platform is moved upwardly or downwardly toward said mother board by the corresponding driving mechanism.

2. The card-mounting rack for electronic part-mounting cards as claimed in claim 1, wherein said mother board side connectors are provided on the top face and the bottom face of said mother board, and a plurality of units each formed from one of said platforms, one of the driving mechanisms and one of the card guides are provided symmetrically in upward and downward directions on the upper and lower sides of said mother board.

3. The card-mounting rack for electronic part-mounting cards as claimed in claim 1, wherein said driving mechanism includes a gondola which retains a card on the corresponding platform and a guide rail which guides said gondola upon upward or downward movement of said platform.

4. The card-mounting rack for electronic part-mounting cards as claimed in claim 1, wherein said driving mechanism includes a ball screw held in meshing engagement with a threaded hole provided on the corresponding platform, a first bevel gear fixed to said ball screw, a second bevel gear held in meshing engagement with said first bevel gear, and a rotating tool which rotates said second bevel gear to rotate said first bevel gear thereby to rotate said ball screw to move said platform upwardly and downwardly.

5. The card-mounting rack for electronic part-mounting cards as claimed in claim 1, wherein said gondola is formed from a material which intercepts magnetism and electromagnetic waves.

6. The card-mounting rack for electronic part-mounting cards as claimed in claim 1, further comprising fans for generating air flows to cool the cards.

7. The card-mounting rack for electronic part-mounting cards as claimed in claim 1, wherein said driving mechanism includes a ball screw held in meshing engagement with a threaded hole provided on the corresponding platform, wherein rotation of said ball screw moves said platform upwardly and downwardly.

8. The card-mounting rack for electronic part-mounting cards as claimed in claim 1, wherein said driving mechanism includes a first bevel gear, a second bevel gear held in meshing engagement with said first bevel gear, and a rotating tool which rotates said second bevel gear to rotate said first bevel gear thereby to move said platform upwardly and downwardly.

9. A card-mounting rack for electronic part-mounting cards for mounting a plurality of cards each having an electronic part and a connector mounted thereon, comprising:

a mother board disposed horizontally;
a plurality of platforms;
means for moving each of said platforms, such that said platforms are displaced upwardly or downwardly toward said mother board;
a card guide provided for each of said platforms which guides one of the cards for movement in a horizontal direction to send the card onto the platform; and
a mother board side connector provided on a bottom face or a top face of said mother board for each of the cards;
the connector of any of the cards being connected to one of the mother board side connectors when, after the card is sent onto the corresponding platform under the guidance of the corresponding card guide, the platform is moved upwardly or downwardly toward said mother board by the corresponding means for moving.

* * * * *